US006413386B1

(12) United States Patent
Callegari et al.

(10) Patent No.: US 6,413,386 B1
(45) Date of Patent: Jul. 2, 2002

(54) REACTIVE SPUTTERING METHOD FOR FORMING METAL-SILICON LAYER

(75) Inventors: Alessandro Cesare Callegari, Yorktown Heights; Eduard Albert Cartier, New York; Michael Abramovich Gribelyuk, Poughquag; Harald Franz Okorn-Schmidt, Putnam Valley; Theodore Harold Zabel, Yorktown Heights, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/619,512

(22) Filed: Jul. 19, 2000

(51) Int. Cl.$^7$ ............................................. C23C 14/34
(52) U.S. Cl. .................. 204/192.23; 136/257; 438/142; 438/381; 438/800
(58) Field of Search ........................ 204/192.15, 192.23; 136/257; 438/142, 381, 800

(56) References Cited

U.S. PATENT DOCUMENTS

| | | | | |
|---|---|---|---|---|
| 5,108,569 A | * | 4/1992 | Gilboa et al. ........... | 204/192.13 |
| 5,132,012 A | * | 7/1992 | Miura et al. ............. | 210/198.2 |
| 5,302,412 A | * | 4/1994 | Tamhankar et al. ......... | 427/102 |
| 5,486,277 A | * | 1/1996 | Barbee, Jr. et al. ..... | 204/192.15 |
| 6,013,553 A | | 1/2000 | Wallace et al. ............. | 438/287 |
| 6,020,243 A | | 2/2000 | Wallace et al. ............. | 438/287 |
| 6,088,216 A | | 7/2000 | Laibowitz et al. ........ | 361/321.4 |

OTHER PUBLICATIONS

Russak et al., "Reactive Magnetron Sputtered Zirconium Oxide and Zirconium Silicon Thin Films," J. Vac. Sci. Technology, A7(3), May/Jun. 1989, pp. 1248–1253.

* cited by examiner

Primary Examiner—Steven H Ver Steeg
(74) Attorney, Agent, or Firm—Robert M. Trepp; Alek P. Szecsy

(57) ABSTRACT

Within a method for forming a metal-silicon layer there is first provided a reactor chamber. There is then positioned within the reactor chamber a substrate spaced from a metal source target. There is also provided within the reactor chamber a minimum of a sputter material and a reactive silicon material. There is then sputtered the metal source target positioned within the reactor chamber with the sputter material provided within the reactor chamber in the presence of the reactive silicon material provided within the reactor chamber to form a metal-silicon layer over the substrate. The method is particularly useful for forming metal silicate layers, metal silicon nitride layers and metal silicon oxynitride layers within microelectronic fabrications. An alternative method employs: (1) a silicon source target rather than a metal source target; and (2) a reactive metal material rather than a reactive silicon material.

22 Claims, 3 Drawing Sheets

REACTIVE SPUTTERING METHOD FOR FORMING METAL-SILICON LAYER

CROSS-REFERENCE TO RELATED APPLICATION

This application is related to co-assigned application Ser. No. 09/413,462, filed Oct. 6, 1999, by Cartier et al., titled "Silicate Gate Dielectric."

BACKGROUND OF THE INVENTION

1. Field of the Invention

The present invention relates generally to methods for forming metal-silicon layers within fabrications including but not limited to microelectronic fabrications. More particularly, the present invention relates to methods for forming, with enhanced compositional control, metal-silicon layers within fabrications including but not limited to microelectronic fabrications.

2. Description of the Related Art

Microelectronic fabrications are formed from microelectronic substrates over which are formed patterned microelectronic conductor layers which are separated by microelectronic dielectric layers.

As microelectronic fabrication integration levels have increased, and more particularly as semiconductor integrated circuit microelectronic fabrication integration levels have increased, there has evolved a continuing and correlating trend towards decreasing linewidth dimensions and thickness dimensions of microelectronic layers which are employed when fabricating microelectronic devices and microelectronic structures employed in fabricating microelectronic fabrications.

Of the microelectronic layers whose thicknesses have traditionally decreased when fabricating advanced microelectronic fabrications, and whose thickness uniformity and materials composition integrity is generally of considerable importance when fabricating microelectronic fabrications, are capacitive dielectric layers which are conventionally employed as: (1) gate dielectric layers within field effect transistors (FETs) within semiconductor integrated circuit microelectronic fabrications; as well as (2) capacitor plate separation dielectric layers within various types of capacitors within various types of microelectronic fabrications, including but not limited to semiconductor integrated circuit microelectronic fabrications.

While continuing decreases in thickness of capacitive dielectric layers are generally desirable in the art of microelectronic fabrication in order to theoretically provide enhanced performance of capacitive devices within advanced microelectronic fabrications, there nonetheless exist considerable technical barriers to forming, with both decreased thickness and enhanced compositional control, capacitive dielectric layers of conventional dielectric materials, such as silicon oxide dielectric materials, silicon nitride dielectric materials, silicon oxynitride dielectric materials and composites thereof, such as to provide enhanced performance of capacitive devices within advanced microelectronic fabrications, and in particular enhanced performance of capacitive devices within advanced semiconductor integrated circuit microelectronic fabrications.

In an effort to provide enhanced performance of capacitive devices within advanced microelectronic fabrications while avoiding decreased thicknesses of capacitive dielectric layers within the capacitive devices, there has been proposed in the alternative of employing conventional silicon oxide dielectric materials, silicon nitride dielectric materials, silicon oxynitride dielectric materials and composites thereof when forming capacitive dielectric layers within advanced microelectronic fabrication, to employ dielectric materials having generally higher dielectric constants, typically and preferably in a range of from about 10 to about 30 (in comparison with a range of from about 4 to about 8 for conventional silicon oxide dielectric materials, silicon nitride dielectric materials, silicon oxynitride dielectric materials and composites thereof). Such dielectric materials having generally higher dielectric constants allow for increased thicknesses of capacitive dielectric layers while simultaneously providing for enhanced capacitive properties of capacitive devices when fabricating microelectronic fabrications. Of the higher dielectric constant dielectric materials which have been proposed for use when forming capacitive dielectric layers within capacitive devices within advanced microelectronic fabrications, metal silicate dielectric materials and nitrided metal silicate dielectric materials (i.e., metal silicon oxynitride dielectric materials), are presently of considerable interest.

While metal silicate dielectric materials, and derivatives thereof, are thus desirable in the art of microelectronic fabrication for use when forming capacitive dielectric layers within capacitive devices within microelectronic fabrications, metal silicate dielectric materials, and derivatives thereof, are similarly nonetheless also not entirely without problems in the art of microelectronic fabrication when forming capacitive dielectric layers within capacitive devices within microelectronic fabrications. In that regard, it is often difficult to form a metal silicate dielectric material, or derivative thereof, with enhanced compositional control when forming a capacitive dielectric layer within a capacitive device within a microelectronic fabrication.

It is thus desirable in the art of microelectronic fabrication to provide methods and materials for forming, with enhanced compositional control, metal silicate dielectric materials, and derivatives thereof, for use when forming capacitive dielectric layers within capacitive devices within microelectronic fabrications.

It is towards the foregoing object that the present invention is directed.

Various methods and materials have been disclosed within various arts for forming capacitive dielectric layers, as well as other types of layers, with desirable properties within various types of fabrications.

For example, Russak et al., in "Reactive magnetron sputtered zirconium oxide and zirconium silicon oxide thin films", in J. Vac. Sci. Technol., A7(3), May/June 1989, pp. 1248–53, discloses a method for forming, with varying optical properties, zirconium silicate layers within optical fabrications. To realize the foregoing object, the method employs a reactive sputtering method employing separate zirconium and silicon targets which are independently sputtered within a single reactor chamber.

In addition, Wallace et al., in U.S. Pat. No. 6,013,553 and U.S. Pat. No. 6,020,243, disclose various methods for forming, for use within a field effect transistor (FET) within a semiconductor integrated circuit microelectronic fabrication, a gate dielectric layer formed of a dielectric material having a comparatively high dielectric constant. To realize the foregoing object, the method employs any. of several deposition methods which may be employed to form the gate dielectric layer of a comparatively high dielectric constant dielectric material selected from the group consisting of hafnium oxynitride dielectric materials, zirconium oxynitride dielectric materials, hafnium silicon oxynitride dielectric materials and zirconium silicon oxynitride dielectric materials.

Finally, Laibowitz et al., in U.S. Pat. No. 6,088,216, disclose an alternative method for forming, for use within a capacitor within a dynamic random access memory (DRAM) cell within a semiconductor integrated circuit microelectronic fabrication, a capacitor plate separation dielectric layer formed of a dielectric material having a comparatively high dielectric constant. To realize the foregoing object, the method employs an ion implantation method through which the capacitor plate separation dielectric layer may be formed of a comparatively high dielectric constant silicate dielectric material such as a barium silicate dielectric material, a lead silicate dielectric material or a composite silicate dielectric material thereof.

Desirable in the art of microelectronic fabrication are additional methods and materials which may be employed for forming, with enhanced compositional control, metal silicate dielectric materials, and derivatives thereof, for use when forming capacitive dielectric layers within capacitive devices within microelectronic fabrications.

It is towards the foregoing object that the present invention is directed.

SUMMARY OF THE INVENTION

A first object of the present invention is to provide a method for forming a metal silicate dielectric layer within a microelectronic fabrication.

A second object of the present invention is to provide a method in accord with the first object of the present invention, wherein the metal silicate dielectric layer is formed with enhanced compositional control.

A third object of the present invention is to provide a method in accord with the first object of the present invention and the second object of the present invention, wherein the method is readily commercially implemented.

In accord with the objects of the present invention, there is provided by the present invention a method for forming a metal-silicon layer. To practice a first embodiment of the method of the present invention, there is first provided a reactor chamber. There is then positioned within the reactor chamber a substrate spaced from a metal source target. There is also provided within the reactor chamber a minimum of a sputter material and a reactive silicon material. There is then sputtered the metal source target positioned within the reactor chamber with the sputter material provided within the reactor chamber in the presence of the reactive silicon material provided within the reactor chamber to form a metal-silicon layer over the substrate.

The present invention also contemplates a second embodiment of the present invention wherein when forming a metal-silicon layer: (1) instead of positioning and sputtering within the reactor chamber the metal source target there is positioned and sputtered within the reactor chamber a silicon source target; and (2) instead of providing within the reactor chamber the reactive silicon material when sputtering within the reactor chamber the metal source target there is provided within the reactor chamber a reactive metal material when sputtering within the reactor chamber the silicon source target.

Thus, in general, the present invention provides when forming a metal-silicon layer over a substrate: (1) a source target selected from one of a metal source target and a silicon source target; and (2) a complementary reactive material selected from one of a reactive silicon material and a reactive metal material.

The present invention provides a method for forming a metal silicate dielectric layer within a microelectronic fabrication, wherein the metal silicate dielectric layer is formed with enhanced compositional control. The present invention realizes the foregoing object by employing when forming a metal-silicon layer over a substrate which may be employed within a microelectronic fabrication, wherein the metal-silicon layer may comprise a metal silicate dielectric layer formed over the substrate which may be employed within the microelectronic fabrication, a reactive sputtering method which employs in a first embodiment a sputtering of a metal source target positioned within a reactor chamber within which is also positioned the substrate spaced from the metal source target, where the reactive sputtering method is undertaken with a sputter material provided within the reactor chamber in the presence of a reactive silicon material provided within the reactor chamber. Within the context of the first embodiment of the present invention, by adjusting a sputter material concentration provided within the reactor chamber within the context of a reactive silicon material concentration provided within the reactor chamber, the metal-silicon layer, which may comprise the metal silicate dielectric layer, may be formed with enhanced compositional control.

The method of the present invention is readily commercially implemented. The present invention employs methods and materials as are otherwise generally known in the art of microelectronic fabrication, but employed within the context of specific process limitations to provide the present invention. Since it is thus a specific set of process limitations which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENTS

Figure 1:
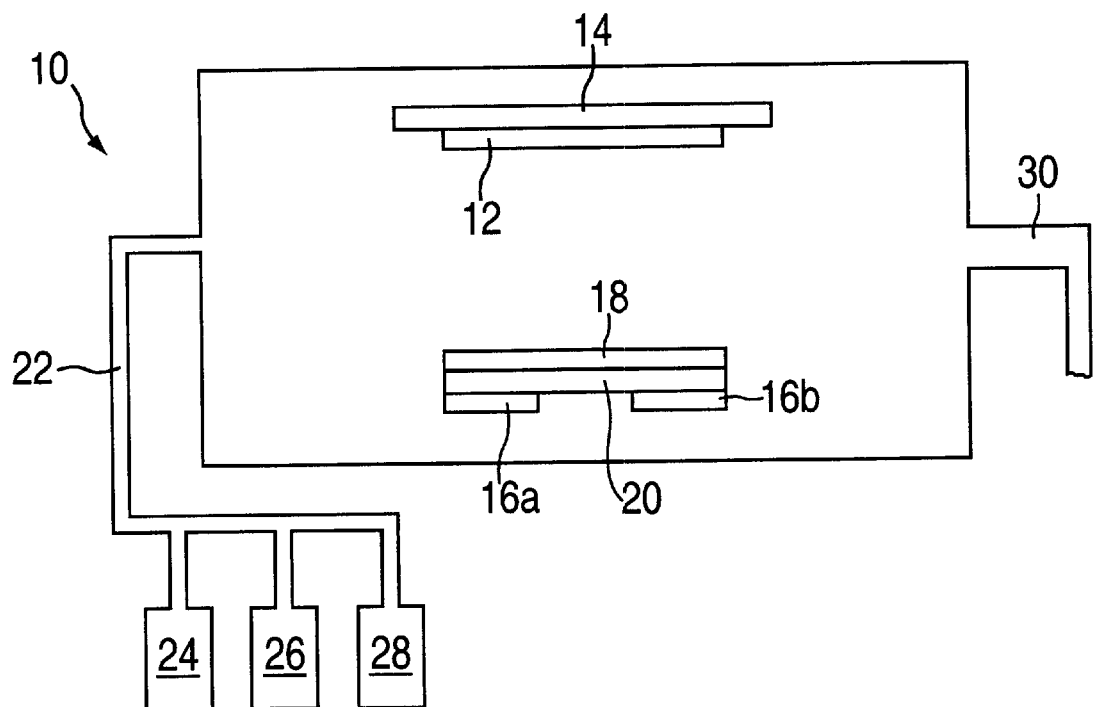
FIG. 1 shows a schematic diagram of a reactive sputtering apparatus which may be employed in conjunction with the method of the present invention.

The present invention provides a method for forming a metal silicate dielectric layer within a microelectronic fabrication, wherein the metal silicate dielectric layer is formed with enhanced compositional control. A first embodiment of the present invention realizes the foregoing object by employing when forming a metal-silicon layer over a substrate which may be employed within a microelectronic fabrication, wherein the metal-silicon layer may comprise a metal silicate dielectric layer formed over the substrate which may be employed within the microelectronic fabrication, a reactive sputtering method which employs sputtering of a metal source target positioned within a reactor chamber within which is also positioned the substrate spaced from the metal source target, with a sputter material provided within the reactor chamber in the presence of a reactive silicon material provided within the reactor chamber. Within the context of the first embodiment of the present invention, by adjusting a sputter material concentration provided within the reactor chamber within the context of a reactive silicon material concentration provided within the reactor chamber, the metal-silicon layer, which may comprise the metal silicate dielectric layer, may be formed with enhanced compositional control.

The present invention also contemplates a second embodiment of the present invention wherein when forming a metal-silicon layer: (1) instead of positioning and sputtering within the reactor chamber the metal source target there is positioned and sputtered within the reactor chamber a silicon source target; and (2) instead of providing within the reactor chamber the reactive silicon material when sputtering within the reactor chamber the metal source target there is provided within the reactor chamber a reactive metal material when sputtering within the reactor chamber the silicon source target.

Within the second embodiment of the present invention, the silicon source target may be formed of a silicon material selected from the group consisting of silicon, silicon oxide, silicon nitride and silicon oxynitride. Similarly, within the second preferred embodiment of the present invention, the reactive metal material may be formed from a metal source material selected from the group consisting of metal hydrides, metal chlorides, metal organics (such as but not limited to metal alkyls or metal carbonyls) and metal alkoxides.

Thus, in general, the present invention provides when forming a metal-silicon layer over a substrate: (1) a source target selected from one of a metal source target and a silicon source target; and (2) a complementary reactive material selected from one of a reactive silicon material and a reactive metal material.

Although the preferred embodiments of the present invention illustrate the present invention more preferably within the context of forming a metal silicate dielectric layer upon a substrate which may be employed when fabricating a microelectronic fabrication, and wherein the metal silicate dielectric layer is preferably employed as a gate dielectric layer within a field effect transistor (FET) employed within a semiconductor integrated circuit microelectronic fabrication or a capacitor plate separation dielectric layer employed within various types of capacitors employed within various types of microelectronic fabrications, the method of the present invention may also be employed for forming, with enhanced compositional control, metal silicide layers, metal silicate layers and derivatives thereof, and in particular nitrided derivatives thereof. Within the present invention, the metal silicide layers, the metal silicate layers and their derivatives may be employed as layers of various types within microelectronic fabrications including but not limited to integrated circuit microelectronic fabrications, ceramic substrate microelectronic fabrications, solar cell optoelectronic microelectronic fabrications, sensor image array optoelectronic fabrications and display image array optoelectronic microelectronic fabrications. Similarly, metal silicide layers, metal silicate layers and their derivatives formed in accord with the present invention may also be employed within fabrications other than microelectronic fabrications, where such other fabrications may include but are not limited optical control fabrications and decorative fabrications.

Referring now to FIG. 1, there is shown a schematic diagram of a-reactive sputtering apparatus which may be employed in conjunction with the method of the present invention.

Shown in FIG. 1, generally, is a reactor chamber 10, having positioned therein, in a first instance, a substrate 12 in turn positioned upon a platen 14.

Within the preferred embodiments of the present invention with respect to the substrate 12, and in accord with the above, the substrate 12 may be a substrate employed within a microelectronic fabrication selected from the group including but not limited to integrated circuit microelectronic fabrications, ceramic substrate microelectronic fabrications, solar cell optoelectronic microelectronic fabrications, sensor image array optoelectronic fabrications and display image array optoelectronic microelectronic fabrications. Similarly, and also in accord with the above, within the context of the present invention, the substrate 12 may also be a substrate employed within a fabrication other than a microelectronic fabrication, wherein fabrications other than microelectronic fabrications may be selected from the group including but not limited to optical control fabrications and decorative fabrications.

Although not specifically illustrated within the schematic diagram of FIG. 1, the substrate 12 may consist of a substrate alone as employed within a fabrication, or in an alternative, the substrate 12 may comprise a substrate as employed within the fabrication, wherein the substrate further has formed thereupon and/or thereover any of several additional layers as are conventionally employed within the fabrication within which is employed the substrate. Similarly with the substrate alone as employed within the fabrication, such additional layers may be formed of materials, and in particular microelectronic materials, selected from the group including but not limited to conductor materials, semiconductor materials and dielectric materials.

In addition, and although also not specifically illustrated within the schematic diagram of FIG. 1, the substrate 12, typically and preferably when the substrate 12 consists of or comprises a microelectronic substrate, such as a semiconductor substrate employed within a semiconductor integrated circuit microelectronic fabrication, has formed therein and/or thereupon any of several microelectronic devices as are conventionally employed within the microelectronic fabrication within which is employed the substrate 12. Such microelectronic devices may be selected from the group including but not limited to resistors, transistors, diodes and capacitors.

Within the preferred embodiments of the present invention with respect to the platen 14, the platen 14 is otherwise conventional in the art of microelectronic fabrication apparatus construction, wherein the platen 14 is typically and preferably designed of dimensions such as to accommodate a minimum of one substrate 12 when reactively sputtering thereupon a metal-silicon layer in accord with the present invention, and wherein the platen 14 may optionally be provided with an ability to rotate the substrate(s) when reactively sputtering thereupon the metal-silicon layer(s) in accord with the present invention.

Shown also positioned within the reactor chamber 10 whose schematic diagram is illustrated in FIG. 1, and spaced from the substrate 12, is a metal source target 18 in-turn positioned upon a backing plate 20 which in-turn has positioned upon its side opposite the metal source target 18 a pair of magnets 16a and 16b.

Within the preferred embodiments of the present invention with respect to the metal source target 18, the metal source target 18 may be formed of a material selected from the group including but not limited to metal materials (i.e., metals and metal alloys), metal oxide materials (including metal alloy oxide materials), metal nitride materials (including metal alloy nitride materials) and metal oxynitride materials (including metal alloy oxynitride materials). With respect to either the metal materials, the metal oxide materials, the metal nitride materials or the metal oxynitride materials from which is formed the metal source target 18, there is typically and preferably employed at least one metal selected from the group consisting of hafnium, zirconium, yttrium, lanthanum, lead, platinum, cobalt, titanium, niobium, tungsten, tantalum, vanadium, gadolinium, aluminum and molybdenum. More typically and preferably, there is employed at least one metal from the group consisting of hafnium and zirconium.

Within the preferred embodiments of the present invention with respect to the backing plate 20, the backing plate 20 is otherwise conventional in the art of microelectronic fabrication apparatus construction, and is intended to provide adequate support and positioning of the metal source target 18 as the metal source target 18 is sputtered and consumed when forming a metal-silicon layer over the substrate 12 while employing the reactive sputtering method in accord with the present invention.

Within the preferred embodiments of the present invention with respect to the pair of magnets 16a and 16b, the pair of magnets 16a and 16b is typically and preferably provided of sufficient magnetic strength to effectively assist in sputtering a metal source material from the metal source target 18 when reactively sputtering the metal source target 18 when forming over the substrate 12 a metal-silicon layer in accord with the present invention.

There is also shown within the schematic diagram of FIG. 1 connected to the reactor chamber 10 a source manifold 22 in turn having connected thereto a sputter source material source 24, a silicon source material source 26 and an optional oxidant/nitridant source material source 28.

Within the preferred embodiments of the present invention with respect to a sputter source material introduced into the reactor chamber 10 from the sputter source material source 24, the sputter source material introduced into the reactor chamber 10 from the sputter source material source 24 may be selected from the group of sputter source material gases including but not limited to argon, krypton and xenon.

Within the preferred embodiment of the present invention with respect to a silicon source material introduced into the reactor chamber 10 from the silicon source material source 26, the silicon source material introduced into the reactor chamber from the silicon source material source 26 may be selected from the group including but not limited to silicon hydrides (such as but not limited to silane, disilane and other higher order normal and cyclic silicon hydrides), silicon chlorides and silicon alkoxides (such as but not limited to tetraethylorthosilicate (TEOS)). Typically and preferably, the silicon source material will be introduced into the reactor chamber 10 diluted within a carrier gas, particularly when the silicon source material is a highly reactive silicon source material gas, such as silane. Typically and preferably, such a highly reactive silicon source material gas will be introduced into the reactor chamber 10 at a substantially diluted concentration of from about 1 to about 5 volume percent of the carrier gas. Within the present invention, the carrier gas may be equivalent to a sputter source material gas, although other carrier gases, such as but not limited to helium carrier gases and hydrogen carrier gases, may be employed and are often preferred.

Within the preferred embodiments of the present invention with respect to an optional oxidant/nitridant source material which is introduced into the reactor chamber 10 from the optional oxidant/nitridant source material source 28, the optional oxidant/nitridant source material which is introduced into the reactor chamber from the optional oxidant/nitridant source material source 28 may be selected from the group of oxidant and/or nitridant source material gases including but not limited to oxygen, ozone, nitrous oxide, nitric oxide, nitrogen and ammonia with oxygen being particularly preferred as an oxidant.

Finally, there is shown within the schematic diagram of FIG. 1 an exhaust 30 through which is exhausted spent source materials employed within the reactor chamber 10 when forming upon the substrate 12 positioned within the reactor chamber 10 a metal-silicon layer in accord with the present invention. The exhaust 30 is typically and preferably connected to a vacuum pump (not otherwise shown within the schematic diagram of FIG. 1), typically and preferably through additional connection of at least one throttle valve (also not otherwise shown in the schematic cross-sectional diagram of FIG. 1). Also not shown within the schematic diagram of FIG. 1 are appropriate power supplies which are employed for: (1) generating a plasma interposed between the metal source target 18 and the substrate 12 (for purposes of activating the sputter source material, the silicon source material, the optional oxidant and/or nitridant source materials to a corresponding sputter material, reactive silicon material, reactive oxidant material and reactive nitridant material, although thermal activation methods may under certain circumstances also be employed); as well as (2) biasing the substrate 12 for purposes of improving metal-silicon layer properties when sputtering of the metal source target 18 with the sputter material in accord with the present invention. Such power supplies are otherwise conventional in the art of microelectronic fabrication apparatus construction.

As is understood by a person skilled in the art, and further although not specifically illustrated within the schematic-diagram of FIG. 1, there may be formed upon the substrate 12 positioned upon the platen 14 in-turn positioned within the reactor chamber 10, by reactive sputtering of the metal source target 18 positioned upon the backing plate 20 in turn positioned within the reactor chamber 10, with the sputter material provided within the reactor chamber 10 in the presence of the reactive silicon material provided within the reactor chamber and optionally the reactive oxidant material and the reactive nitridant material provided within the reactor chamber 10, a metal-silicon layer over the substrate 12. The composition of the metal-silicon layer is determined in a first instance by a composition of the metal source target 18, where: (1) when the metal source target 18 is formed of a metal the metal-silicon layer may in a first instance be formed as a metal silicide; (2) when the metal source target 18 is formed of a metal oxide the metal-silicon layer may in a first instance be formed as a metal silicate; (3) when the metal source target 18 is formed of a metal nitride the metal-silicon layer may in a first instance be formed as a metal silicon nitride; and (4) when the metal source target 18 is formed of a metal oxynitride the metal-silicon layer may in a first instance be formed as a metal silicon oxynitride. Significant to the present invention is an ability to control within a metal silicide metal-silicon layer, a metal silicate metal-silicon layer, a metal silicon nitride metal-silicon layer or a metal silicon oxynitride metal-silicon layer a metal:silicon atomic ratio by means of adjusting a concentration within a reactor chamber of a sputter material with respect to a reactive silicon material (or in an alternative by means of adjusting a concentration within the reactor chamber of a sputter material with respect to a reactive metal material when employing a silicon source target)(the former is typically and preferably effected by controlling a sputter source material flow rate with respect to a silicon source material flow rate). Similarly, and also of significance with respect to the present invention is an ability to control within a metal silicate metal-silicon layer, a metal silicon nitride metal-silicon layer or a metal silicon oxynitride metal-silicon layer formed upon the substrate 12, as appropriate, a metal:oxygen:nitrogen atomic ratio not only through an oxide content and/or a nitride content of a metal oxide metal source target 18, a metal nitride metal source target 18 or a metal oxynitride metal source target 18, but also through a concentration of the sputter material with respect to an optional reactive oxidant material or reactive nitridant material provided within the reactor chamber (such is typically and preferably effected by controlling a flow rate of the sputter source material with respect to an optional oxidant source material and/or an optional nitridant source material).

Within the context of the present invention, for purposes of forming either a metal silicide metal-silicon layer over the substrate 12, a metal silicate metal-silicon layer over the substrate 12, a metal silicon nitride metal-silicon layer over the substrate 12 or a metal silicon oxynitride metal-silicon layer over the substrate 12, there is typically and also preferably employed: (1) a reactor chamber 10 deposition pressure of from about 1 to about 100 mtorr; (2) a source and bias power of from about 0.5 to about 40 watts per square centimeter of target area; (3) a conventional magnetic field strength; (4) a substrate 12 temperature of from about zero to about 800 degrees centigrade; (5) an argon sputter source material flow rate of from about 1 to about 100 standard cubic centimeters per minute (sccm); (6) a 2 percent silane in helium carrier gas silicon source material flow rate of from about 1 to about 100 standard cubic centimeters per minute (sccm); (7) an optional oxygen oxidant source material flow rate of up to about 100 standard cubic centimeters per minute (sccm); and (8) an optional nitrogen nitridant source material flow rate of up to about 100 standard cubic centimeters per minute (sccm).

Typically and preferably a metal suicide metal-silicon layer, a metal silicate metal-silicon layer, a metal silicon nitride metal-silicon layer or a metal silicon oxynitride metal-silicon layer formed in accord with the present invention is formed to a thickness of from about 5 to about 1000 angstroms.

Most typically and preferably, the reactive sputtering method of the present invention is employed for forming a hafnium silicate layer, a zirconium silicate layer or a derivative layer thereof as a capacitive dielectric layer within a capacitive device within a semiconductor integrated circuit microelectronic fabrication.

As is further understood by a person skilled in the art, a metal-silicon layer formed in accord with the present invention may be further annealed within annealing environments as are conventional in the art of microelectronic fabrication, in order to improve or stabilize properties, including but not limited to physical properties and electrical properties, of the metal-silicon layer formed in accord with the present invention. Such annealing environments may include, but are not limited to oxidizing (i.e., oxygen containing) annealing environments, as well as reducing (i.e., hydrogen or forming gas (nitrogen/hydrogen mixture) containing) annealing environments as are otherwise conventional in the art of microelectronic fabrication.

Upon forming while employing the reactor chamber 10 whose schematic diagram is illustrated in FIG. 1 a metal silicide metal-silicon layer, a metal silicate metal-silicon layer, a metal silicon nitride metal-silicon layer or a metal silicon oxynitride metal-silicon layer formed over the substrate 12 positioned within the reactor chamber 10 while employing the method of the present invention, there is formed the metal silicide metal-silicon layer, the metal silicate metal-silicon layer, the metal silicon nitride metal silicon layer or the metal-silicon oxynitride metal silicon layer with enhanced compositional control. Such enhanced compositional control is realized within a first embodiment of the present invention when forming the metal silicide metal-silicon layer, the metal silicate metal-silicon layer, the metal silicon nitride metal-silicon layer or the metal silicon oxynitride metal-silicon layer by employing within a reactive sputtering method a sputtering of a metal source target with a sputter material in the presence of a reactive silicon material, each of whose concentrations may be varied.

EXAMPLES

A series of silicon semiconductor substrate wafers was first treated by immersion in a 40:1 dilute aqueous hydrofluoric acid solution for a period of about 1 minute in order to remove a series of native oxide coatings formed thereupon and to provide a series of hydrogenated surfaces to the series of silicon semiconductor substrates. Upon the silicon semiconductor substrates there was then formed while employing a reactive sputtering method in accord with the preferred embodiments of the present invention a series of hafnium silicate layers. For comparison purposes in accord with the examples which follow, there was also formed upon additional equivalently prepared silicon semiconductor substrates either: (1) hafnium oxide layers (employing a generally equivalent reactive sputtering method but absent a silicon source material when reactively sputtering a hafnium oxide metal source target); or (2) silicon oxide layers (employing a generally equivalent reactive sputtering method but absent reactively sputtering a hafnium oxide metal source target when forming a plasma which decomposes a 2 percent silane in helium carrier gas mixture).

The reactive sputtering method also employed when forming the series of hafnium silicate layers: (1) a reactor chamber pressure of about 3 mtorr; (2) a radio frequency source and bias power of about 2.4 watts per square centimeter of target area; (3) a conventional magnetic field strength; (4) a semiconductor substrate temperature of about 22 degrees centigrade or a semiconductor substrate temperature of about 500 degrees centigrade; (5) a hafnium oxide metal source target of stoichiometric $HfO2$ composition; (6) an argon sputter source material flow rate of about 10 standard cubic centimeters per minute (sccm); (7) a 2 percent silane in helium carrier gas silicon source material flow rate ranging from about 10 to about 30 standard cubic centimeters per minute (sccm) in order to effect compositional variations in the hafnium silicate layers; and (8) an oxygen oxidant source material flow rate of about 3 standard cubic centimeters per minute (sccm). Unless otherwise specified, each of the resulting hafnium silicate metal-silicon layers was formed to a thickness of about 20 to about 2000 angstroms.

Subsequent to forming the series of hafnium silicate layers, hafnium oxide layers and silicon oxide layers upon the series of semiconductor substrates, there were measured various chemical, physical and electrical properties of the series of hafnium silicate layers, hafnium oxide layers and silicon oxide layers. The series of chemical, physical and electrical measurements included: (1) a chemical compositional analysis for a first series of hafnium silicate layers, and for comparison a hafnium oxide layer, employing high energy (i.e. approximately 1 MeV) ion beam nuclear reaction analysis methods as are otherwise conventional in the art of microelectronic fabrication; (2) a cross-sectional morphology analysis for a second series of hafnium silicate layers, and for comparison purposes a hafnium oxide layer and a silicon oxide layer, while employing a transmission electron microscopy method as is otherwise conventional in the art of microelectronic fabrication; (3) an optical analysis for a third series of hafnium silicate layers, and for comparison purposes a silicon substrate, while employing a reflectance method as is otherwise conventional in the art of microelectronic fabrication; (4) a capacitance-voltage analysis for a pair of fourth hafnium silicate layers, while employing a capacitance-voltage measurement method as is otherwise conventional in the art of microelectronic fabrication; and (5) a dielectric constant analysis of a fifth series of hafnium silicate layers, and for comparison purposes a hafnium oxide layer and a silicon oxide layer, which were determined employing a calculation method which employed an oxide equivalent thickness determined employing the capacitance-voltage measurements for the fourth series of hafnium oxide layers, in conjunction with actual thickness measurements determined employing the transmission electron microscopy method with respect to the second series of hafnium oxide layers or the optical method with respect to the third series of hafnium oxide layers. Results of the above analyses are as follows.

Figure 2:
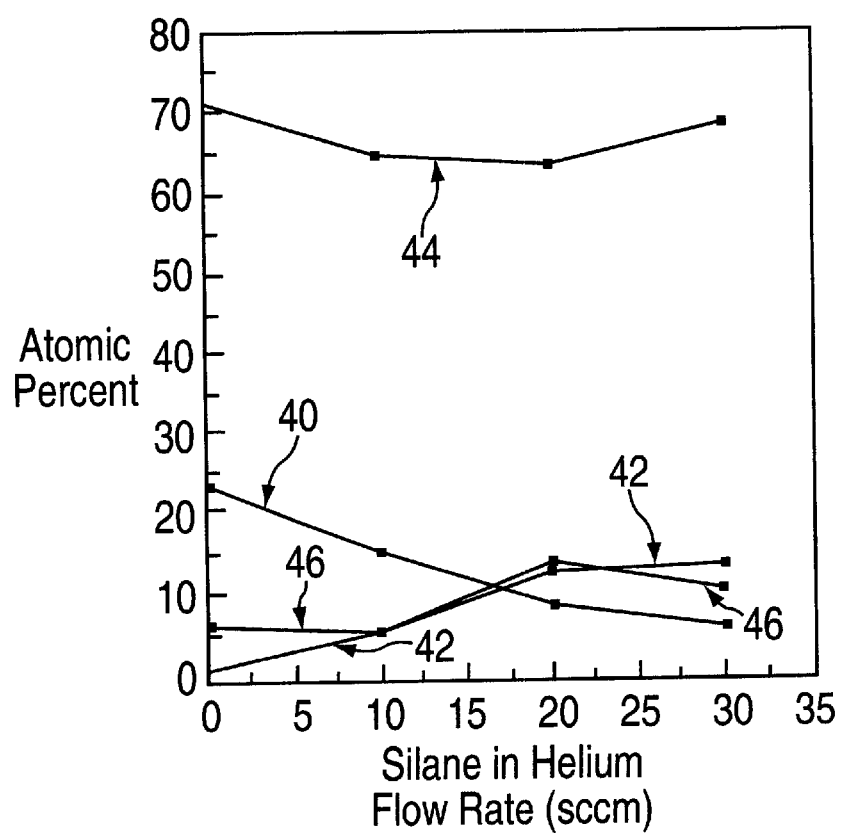
FIG. 2 shows a graph of Atomic Percent versus Silane in Helium Flow Rate for a series of hafnium silicate layers formed upon a series of substrates in accord with the method of the present invention.

First, with respect to the chemical compositional analysis of the first series of hafnium silicate layers, there is illustrated within the graph of FIG. 2 a plot of Atomic Percent versus Silane in Helium Flow Rate for the first series of hafnium silicate layers, which were formed at a deposition temperature of 22 degrees centigrade. Within the graph of FIG. 2, the curve which corresponds with reference numeral 40 corresponds with hafnium atomic percentage, the curve which corresponds with reference numeral 42 corresponds with silicon atomic percentage, the curve which corresponds with reference numeral 44 corresponds with oxygen atomic percentage and the curve which corresponds with reference numeral 46 corresponds with hydrogen atomic percentage.

As is seen by review of the data contained within the graph of FIG. 2, and as is expected within the context of the present invention, while a series of oxygen atomic percentages and a series of hydrogen atomic percentages within the first series of hafnium silicate layers formed in accord with the present invention are relatively constant, a series of hafnium atomic percentages and a series of silicon atomic percentages within the first series of hafnium silicate layers vary inversely.

Second, with respect to the cross-sectional morphology analysis of the second series of hafnium silicate layers, and although not specifically illustrated within the context of a schematic diagram or a graph, there was observed with respect to each of the hafnium silicate layers within the second series of hafnium silicate layers formed over a series of corresponding silicon semiconductor substrates an initial formation of a corresponding series of silicon oxide interfacial layers. The series of silicon oxide interfacial layers is believed to be formed interposed between the corresponding series of semiconductor substrates and the second series of hafnium silicate layers due to the presence of a reactive oxidant material when forming the second series of hafnium silicate layers. The second series of hafnium silicate layers included hafnium silicate layers formed at both 22 degrees centigrade and 500 degrees centigrade.

Figure 3:
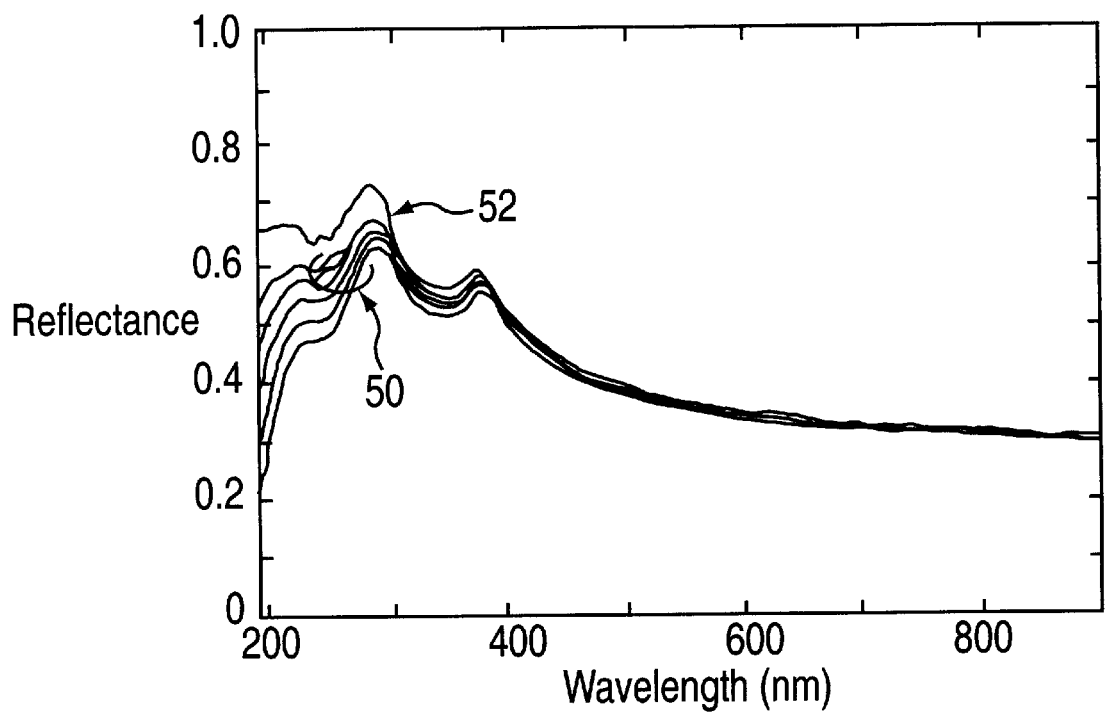
FIG. 3 shows a graph of Reflectance versus Wavelength for a'series of hafnium silicate layers formed upon a series of substrates in accord with the method of the present invention.

Third, with respect to the optical analysis for the third series of hafnium silicate layers, there is shown within FIG. 3 a graph illustrating a plot of Reflectance versus Wavelength for the third series of hafnium silicate layers, and for comparison purposes a silicon substrate. Within the graph of FIG. 3, the series of curves which corresponds with reference numeral 50 corresponds with reflectance measurements for the series of hafnium silicate layers (with increasing reflectance corresponding with increasing silicon content), while the curve which corresponds with reference numeral 52 corresponds with a reflectance measurement for the silicon substrate.

As is seen from review of the data contained within the graph of FIG. 3, and in particular with respect to reflectance measurements for the third series of hafnium silicate layers as measured within the ultraviolet region at about 200 to about 400 nanometers, hafnium silicate layers formed in accord with the present invention may be formed with varying levels of optical reflectance which may be tuned for specific purposes, while maintaining a single hafnium silicate layer thickness.

Figure 4:
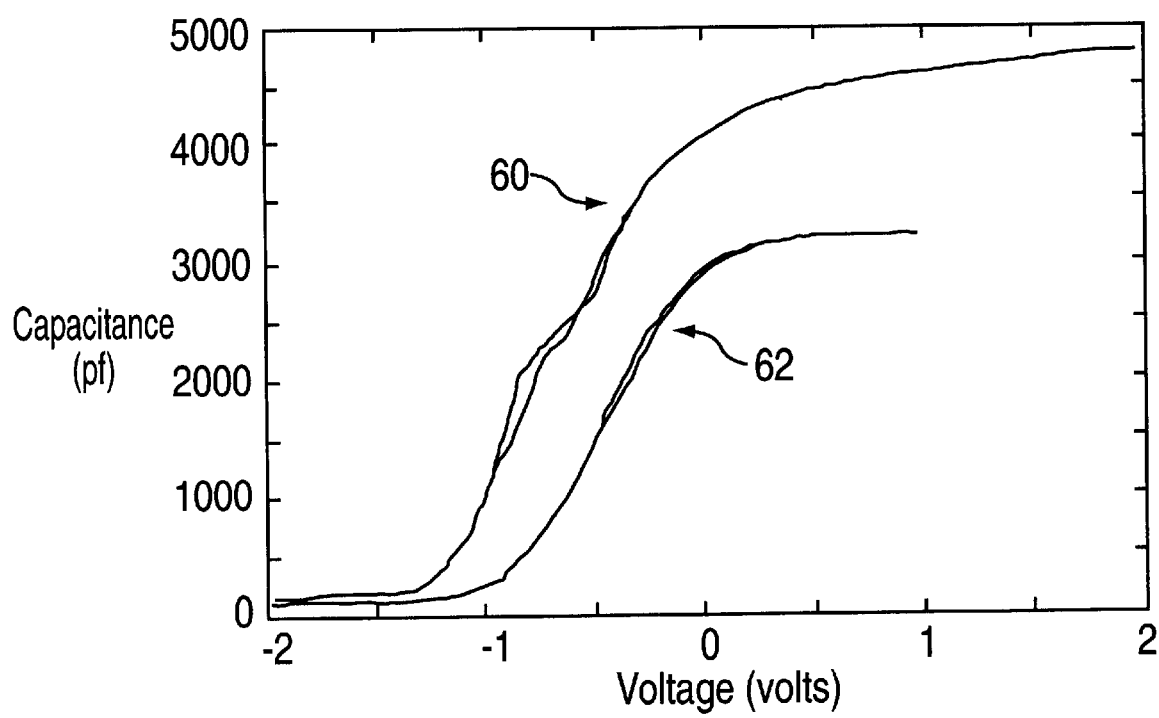
FIG. 4 shows a graph of Capacitance versus Voltage for a pair of hafnium silicate layers formed upon a pair of substrates in accord with the method of the present invention.

Fourth, with respect to the capacitance-voltage analysis for the fourth pair of hafnium silicate layers, there is shown within FIG. 4 a graph illustrating a plot of Capacitance versus Voltage for the pair of hafnium silicate layers. Within FIG. 4, the curve which corresponds with reference numeral 60 corresponds with a hafnium silicate layer of Hf:Si:O atomic ratio about 28:6:66, which has equivalent capacitive characteristics of a silicon oxide layer formed to a thickness of less than about 10 angstroms, although the hafnium silicate layer is formed to a thickness of about 20 angstroms. Similarly, the curve which corresponds with reference numeral 62 corresponds with a hafnium silicate layer of Hf:Si:O atomic ratio about 4:32:64, which has equivalent capacitive characteristics of a silicon oxide layer formed to a thickness of about 30 angstroms, although the hafnium silicate layer is formed to a thickness of about 45 angstroms.

As is seen from review of the data within the graph of FIG. 4, there is provided by the present invention hafnium silicate layers of varying compositions and increased thicknesses which provide substantial variations in capacitance as a function of applied voltage such as to provide enhanced capacitive properties within capacitive devices within which are employed the hafnium silicate layers.

Figure 5:
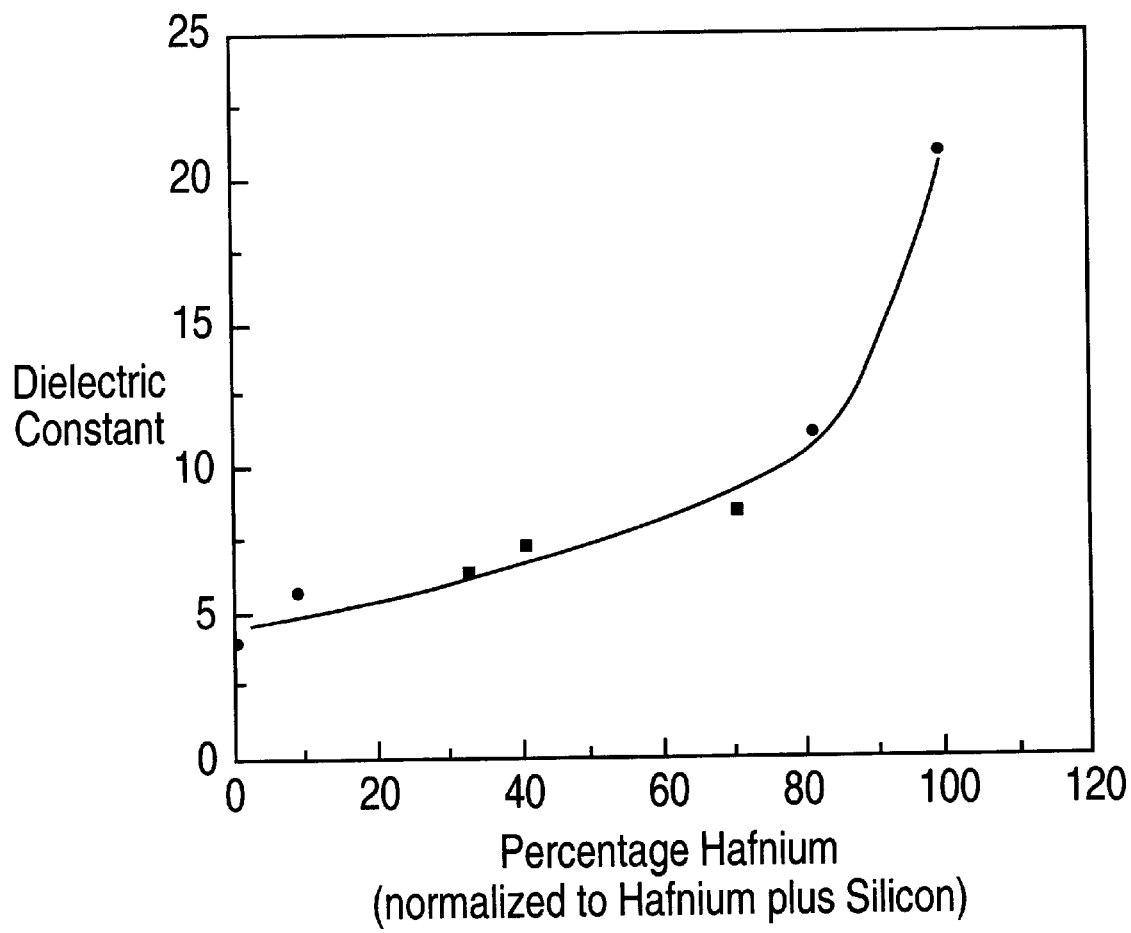
FIG. 5 shows a graph of Dielectric Constant versus Percentage Hafnium for a series of hafnium silicate layers formed upon a series of substrates in accord with the method of the present invention.

Fifth, and finally with respect to the dielectric constant analysis for the fifth series of hafnium silicate layers, there is shown within FIG. 5 a graph illustrating a plot of Dielectric Constant versus Percentage Hafnium (normalized to total hafnium plus silicon) calculated for the fifth series of hafnium silicate layers formed in accord with the present invention.

As is shown within the graph of FIG. 5, dielectric constants for the hafnium silicate layers smoothly vary between a low boundary value of about 3.9 corresponding with a silicon oxide layer, to a high boundary value of about 21 corresponding with a hafnium oxide layer. Thus, within the context of the present invention there may be readily provided within a microelectronic fabrication a hafnium silicate layer with a varying and increased dielectric constant in comparison with a silicon oxide layer, such that there may be readily employed an increased and more readily controlled thickness and composition of the hafnium silicate layer in comparison with a conventional silicon oxide dielectric layer, silicon nitride dielectric layer, silicon oxynitride dielectric layer or composite dielectric layer thereof, such that there may be provided capacitive devices within microelectronic fabrication with enhanced performance.

As is understood by a person skilled in the art, the preferred embodiments and examples of the present invention are illustrative of the present invention rather than limiting of the present invention. Revisions and modifications may be made to methods, materials, structures and dimensions through which are provided hafnium silicate dielectric layers in accord with the preferred embodiments and examples of the present invention while still providing metal silicide metal-silicon layers, metal silicate metal-silicon layers, metal silicon nitride metal-silicon layers and metal silicon oxynitride metal-silicon layers in accord with the present invention, further in accord with the accompanying claims.

What is claimed is:

1. A method for forming a metal-silicon layer comprising:

providing a reactor chamber;

positioning within the reactor chamber a substrate spaced from a silicon source target, providing also within the reactor chamber a minimum of a sputter material and a reactive metal material formed from a metal source material selected from the group consisting of metal hydrides, metal chlorides, metal organics and metal alkoxides; and sputtering the silicon source target positioned within the reactor chamber with the sputter material provided within the reactor chamber in the presence of the reactive metal material provided within the reactor chamber to form a metal-silicon layer over the substrate.

2. The method of claim 1 wherein the metal-silicon layer is selected from the group consisting of metal silicide layers, metal silicate layers, metal silicon nitride layers and metal silicon oxynitride layers.

3. The method of claim 1 wherein the silicon source target is formed from a material selected from the group consisting of silicon materials, silicon oxide materials, silicon nitride materials and silicon oxynitride materials.

4. A method for forming a metal-silicon layer comprising:

providing a reactor chamber:

positioning within the reactor chamber a metal source target but not a silicon source target;

positioning also within the reactor chamber a substrate spaced from the metal source target; providing also within the reactor chamber a minimum of a sputter material and a reactive silicon material;

sputtering the metal source target positioned within the reactor chamber with the sputter material provided within the reactor chamber in the presence of the reactive silicon material provided within the reactor chamber to form a metal-silicon layer over the substrate, wherein the metal-silicon layer comprises at least one metal selected from the group consisting of hafnium, zirconium, yttrium, lanthanum, lead, platinum, cobalt, niobium tungsten, vanadium, gadolinium and molybdenum metals.

5. The method of claim 4 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic fabrications and display image array optoelectronic microelectronic fabrications.

6. The method of claim 4 wherein the metal source target is formed from a material selected from the group consisting of metal materials, metal oxide materials, metal nitride materials and metal oxynitride materials.

7. The method of claim 4 wherein a sputter source material from which is formed the sputter material is selected from the group consisting of argon, krypton and xenon.

8. The method of claim 4 wherein a silicon source material from which is formed the reactive silicon material is selected from the group consisting of silicon hydrides, silicon chlorides and silicon alkoxides.

9. The method of claim 4 wherein the reactive silicon material is diluted within the reactor chamber while employing a diluent gas.

10. The method of claim 4 wherein by adjusting within the reactor chamber a concentration of the sputter material with respect to a concentration of the reactive silicon material a metal:silicon atomic ratio within the metal-silicon layer is adjusted.

11. The method of claim 4 further comprising providing within the reactor chamber at least one of a reactive oxidant material and a reactive nitridant material along with the sputter material and the reactive silicon material.

12. The method of claim 11 wherein the at least one of the reactive oxidant material and the reactive nitridant material is formed from an oxidant source material and/or a nitridant source material selected from the group consisting of oxygen, ozone, nitrous oxide, nitric oxide, nitrogen and ammonia.

13. The method of claim 11 wherein by adjusting a concentration of the sputter material with respect to the reactive oxidant material and the reactive nitridant material a metal:oxygen:nitrogen atomic ratio within the metal-silicon layer is adjusted.

14. The method of claim 4 wherein:

the metal-silicon layer is selected from the group consisting of metal silicate layers, metal silicon nitride layers and metal silicon oxynitride layers; and the metal-silicon layer is employed as a gate dielectric layer within a field effect transistor (FET).

15. The method of claim 4 wherein:

the metal-silicon layer is selected from the group consisting of metal silicate layers, metal silicon nitride layers and metal silicon oxynitride layers; and the metal-silicon layer is employed as a capacitor plate separation dielectric layer within a capacitor.

16. A method for forming a metal-silicon layer comprising:

providing a reactor chamber;

positioning within the reactor chamber a metal source target but not a silicon source target;

positioning also within the reactor chamber a substrate employed within a non-microelectronic fabrication selected from the group consisting of optical control fabrications and decorative coating fabrications, the substrate being spaced from the metal source target;

providing also within the reactor chamber a minimum of a sputter material and a reactive silicon material;

sputtering the metal source target positioned within the reactor chamber with the sputter material provided within the reactor chamber in the presence of the reactive silicon material provided within the reactor chamber to form a metal-silicon layer over the substrate.

17. A method for forming a metal-silicon layer comprising:

providing a reactor chamber;

positioning within the reactor chamber a metal source target but not a silicon source target;

positioning also within the reactor chamber a substrate spaced from the metal source target;

providing also within the reactor chamber a minimum of a sputter material and a reactive silicon material;

sputtering the metal source target positioned within the reactor chamber with the sputter material provided within the reactor chamber in the presence of the reactive silicon material provided within the reactor chamber to form a metal-silicon layer over the substrate, wherein the metal-silicon layer is employed as an optical control layer.

18. A method for forming a metal-silicon layer comprising:

providing a reactor chamber;

positioning within the reactor chamber a metal source target but not a silicon source target;

positioning also within the reactor chamber a substrate spaced from the metal source target;

providing also within the reactor chamber a minimum of a sputter material and a reactive silicon material;

sputtering the metal source target positioned within the reactor chamber with the sputter material provided within the reactor chamber in the presence of the reactive silicon material provided within the reactor chamber to form a metal-silicon layer over the substrate, wherein the metal-silicon layer comprises at least one metal selected from the group consisting of hafnium and zirconium metals.

19. The method of claim 18 wherein the metal-silicon layer is selected from the group consisting of metal silicide layers, metal silicate layers, metal silicon nitride layers and metal silicon oxynitride layers.

20. A method for forming a metal-silicon layer comprising:

providing a reactor chamber;

positioning within the reactor chamber a metal source target but not a silicon source target, the metal source target comprising at least one metal selected from the group consisting of hafnium, zirconium, yttrium, lanthanum, lead, platinum, cobalt, niobium, tungsten, vanadium, gadolinium and molybdenum metals;

positioning also within the reactor chamber a substrate spaced from the metal source target;

providing also within the reactor chamber a minimum of a sputter material and a reactive silicon material;

sputtering the metal source target positioned within the reactor chamber with the sputter material provided within the reactor chamber in the presence of the reactive silicon material provided within the reactor chamber to form a metal-silicon layer over the substrate.

21. The method of claim 20 wherein the metal-silicon layer is selected from the group consisting of metal silicide layers, metal silicate layers, metal silicon nitride layers and metal silicon oxynitride layers.

22. A method for forming a metal-silicon layer comprising:

providing a reactor chamber, positioning within the reactor chamber a metal source target but not a silicon source target;

positioning also within the reactor chamber a substrate spaced from the metal source target;

providing also within the reactor chamber a minimum of a sputter material and a reactive silicon material;

sputtering the metal source target positioned within the reactor chamber with the sputter material provided within the reactor chamber in the presence of the reactive silicon material provided within the reactor chamber to form a metal-silicon layer over the substrate, wherein the metal-silicon layer is selected from the group consisting of metal silicide layers, metal silicate layers, metal silicon nitride layers and metal silicon oxynitride layers which comprise at least one metal selected from the group consisting of hafnium, zirconium, yttrium, lanthanum, lead, platinum, cobalt, niobium, tungsten, vanadium, gadolinium and molybdenum metals.

* * * * *